US008749675B2

(12) United States Patent
Koizumi et al.

(10) Patent No.: US 8,749,675 B2
(45) Date of Patent: Jun. 10, 2014

(54) SOLID STATE IMAGE PICKUP DEVICE AND CAMERA WHICH CAN PREVENT COLOR MIXTURE

(71) Applicant: Canon Kabushiki Kaisha, Tokyo (JP)

(72) Inventors: Toru Koizumi, Yokohama (JP); Akira Okita, Yamato (JP); Masanori Ogura, Atsugi (JP); Shin Kikuchi, Isehara (JP); Tetsuya Itano, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/752,748

(22) Filed: Jan. 29, 2013

(65) Prior Publication Data

US 2013/0140438 A1    Jun. 6, 2013

Related U.S. Application Data

(62) Division of application No. 13/153,695, filed on Jun. 6, 2011, now Pat. No. 8,390,708, which is a division of application No. 12/259,359, filed on Oct. 28, 2008, now Pat. No. 7,978,241, which is a division of application No. 11/373,191, filed on Mar. 13, 2006, now Pat. No. 7,460,162.

(30) Foreign Application Priority Data

Mar. 18, 2005  (JP) ................................. 2005-080342

(51) Int. Cl.
  *H04N 5/335*    (2011.01)
  *H04N 5/222*    (2006.01)
(52) U.S. Cl.
  USPC ........... 348/294; 348/302; 348/371; 348/272; 257/431; 257/450

(58) Field of Classification Search
  USPC .............. 348/E3.021, E5.091, 272–282, 294, 348/302, 311; 257/291, E27.131, E27.132, 257/E3.021, 448, 450, 452, 459, 461, 463, 257/466
  See application file for complete search history.

(56) References Cited

U.S. PATENT DOCUMENTS

| 5,121,225 A | 6/1992 | Murata et al. ................. 358/471 |
| 5,245,203 A | 9/1993 | Morishita et al. ............. 257/113 |
| 5,261,013 A | 11/1993 | Murata et al. .................. 382/65 |
| 5,352,920 A | 10/1994 | Morishita et al. ............. 257/435 |

(Continued)

OTHER PUBLICATIONS

S. Sugawa et al., "A 100dB Dynamic Range CMOS Image Sensor Using a Lateral Overflow Integration Capacitor," 2005 IEEE International Solid-State Circuits Conference, pp. 352,353 and 603 (Feb. 8, 2005).

*Primary Examiner* — Hung Lam
(74) *Attorney, Agent, or Firm* — Fitzpatrick, Cella, Harper & Scinto

(57) ABSTRACT

A solid state image pickup device which can prevent color mixture by using a layout of a capacitor region provided separately from a floating diffusion region and a camera using such a device are provided. A photodiode region is a rectangular region including a photodiode. A capacitor region includes a carrier holding unit and is arranged on one side of the rectangle of the photodiode region as a region having a side longer than the one side. In a MOS unit region, an output unit region including an output unit having a side longer than the other side which crosses the one side of the rectangle of the photodiode region is arranged on the other side. A gate region and the FD region are arranged between the photodiode region and the capacitor region.

9 Claims, 7 Drawing Sheets

(56) References Cited

U.S. PATENT DOCUMENTS

| | | | |
|---|---|---|---|
| 5,475,211 A | 12/1995 | Ogura et al. | 250/208.1 |
| 5,698,892 A | 12/1997 | Koizumi et al. | 257/620 |
| 6,188,094 B1 | 2/2001 | Kochi et al. | 257/232 |
| 6,489,200 B1 * | 12/2002 | Leu et al. | 438/257 |
| 6,605,850 B1 | 8/2003 | Kochi et al. | 257/431 |
| 6,670,990 B1 | 12/2003 | Kochi et al. | 348/310 |
| 6,946,637 B2 | 9/2005 | Kochi et al. | 250/208.1 |
| 6,960,751 B2 | 11/2005 | Hiyama et al. | 250/208.1 |
| 7,016,089 B2 | 3/2006 | Yoneda et al. | 358/482 |
| 7,110,030 B1 | 9/2006 | Kochi et al. | 348/308 |
| 7,126,102 B2 | 10/2006 | Inoue et al. | 250/214 |
| 7,187,052 B2 | 3/2007 | Okita et al. | 257/444 |
| 7,324,144 B1 | 1/2008 | Koizumi | 348/294 |
| 7,348,615 B2 | 3/2008 | Koizumi | 257/292 |
| 7,605,415 B2 | 10/2009 | Koizumi et al. | 257/291 |
| 7,639,298 B2 | 12/2009 | Oita et al. | 348/308 |
| 7,701,493 B2 | 4/2010 | Mauritzson | 348/241 |
| 7,872,286 B2 | 1/2011 | Okita et al. | 257/291 |
| 2003/0164887 A1 | 9/2003 | Koizumi et al. | 348/308 |
| 2004/0119864 A1 | 6/2004 | Kikuchi | 348/308 |
| 2005/0122418 A1 | 6/2005 | Okita et al. | 348/340 |
| 2005/0168618 A1 | 8/2005 | Okita et al. | 348/335 |
| 2005/0174552 A1 | 8/2005 | Takada et al. | 355/53 |
| 2005/0179796 A1 | 8/2005 | Okita et al. | 348/308 |
| 2005/0185074 A1 | 8/2005 | Yoneda et al. | 348/294 |
| 2005/0268960 A1 | 12/2005 | Hiyama et al. | 136/244 |
| 2005/0269604 A1 | 12/2005 | Koizumi et al. | 257/291 |
| 2006/0027843 A1 | 2/2006 | Ogura et al. | 257/291 |
| 2006/0043261 A1 | 3/2006 | Matsuda et al. | 250/208.1 |
| 2006/0043393 A1 | 3/2006 | Okita et al. | 257/93 |
| 2006/0043439 A1 | 3/2006 | Koizumi | 257/291 |
| 2006/0043440 A1 | 3/2006 | Hiyama et al. | 257/291 |
| 2006/0044434 A1 | 3/2006 | Okita et al. | 348/294 |
| 2006/0044439 A1 | 3/2006 | Hiyama et al. | 348/308 |
| 2006/0119720 A1 | 6/2006 | Hong | 348/308 |
| 2006/0157759 A1 | 7/2006 | Okita et al. | 257/292 |
| 2006/0158539 A1 | 7/2006 | Koizumi et al. | 348/300 |
| 2006/0158543 A1 | 7/2006 | Ueno et al. | 348/308 |
| 2006/0203114 A1 | 9/2006 | Xu | 348/308 |
| 2006/0208161 A1 | 9/2006 | Okita et al. | 250/208.1 |
| 2006/0208292 A1 | 9/2006 | Itano et al. | 257/292 |
| 2006/0221667 A1 | 10/2006 | Ogura et al. | 365/149 |
| 2007/0018080 A1 | 1/2007 | Inoue et al. | 250/214 |
| 2007/0057158 A1 | 3/2007 | Hong | 250/214.1 |
| 2007/0085110 A1 | 4/2007 | Okita et al. | 257/239 |
| 2007/0126886 A1 | 6/2007 | Sakurai et al. | 348/222.1 |
| 2007/0205439 A1 | 9/2007 | Okita et al. | 257/228 |

* cited by examiner

SOLID STATE IMAGE PICKUP DEVICE AND CAMERA WHICH CAN PREVENT COLOR MIXTURE

CROSS REFERENCE TO RELATED APPLICATIONS

The present application is a division of application Ser. No. 13/153,695, filed Jun. 6, 2011, which is a division of U.S. application Ser. No. 12/259,359, filed on Oct. 28, 2008, now U.S. Pat. No. 7,978,241, issued on Jul. 12, 2011, which is a division of U.S. application Ser. No. 11/373,191, filed on Mar. 13, 2006, now U.S. Pat. No. 7,460,162, issued on Dec. 2, 2008. The entire disclosures of these earlier applications are hereby incorporated herein by reference.

BACKGROUND OF THE INVENTION

1. Field of the Invention

The invention relates to a solid state image pickup device and a camera and, more particularly, is suitable for use in a CMOS area sensor.

2. Related Background Art

In recent years, the CMOS area sensor in which a photodiode and a MOS transistor are formed as one chip is used as a solid state image pickup device. The CMOS area sensor has such advantages that electric power consumption is smaller, a driving electric power is smaller, and a higher processing speed can be realized as compared with those of a CCD. The general CMOS area sensor is constructed by forming a plurality of pixels in a matrix shape, in which each pixel has: a photodiode; a floating diffusion (hereinbelow, also abbreviated to FD as necessary) region; a transfer transistor for transferring carriers from the photodiode to the FD region; and a reset transistor for resetting the FD region to a predetermined electric potential.

A technique regarding the CMOS area sensor whose dynamic range is widened has been examined (for example, refer to Shigetoshi Sugawa, and other five persons, "A 100 db Dynamic Range CMOS Image Sensor Using a Lateral Overflow Integration Capacitor", ISSCC 2005/SESSION19/IMAGES/19.4, DIGEST OF TECHNICAL PAPERS, 2005 IEEE International Solid-State Circuit Conference, Feb. 8, 2005, p 352-353, 603). According to the CMOS area sensor in the above non-Patent Document, in each pixel, further, a capacitor region whose capacitance is larger than that of the FD is formed, one terminal of the capacitor region is connected to the FD through a switch, and the other terminal of the capacitor region is connected to the ground. Thus, when carriers overflow from the photodiode by strong light, the overflowed carriers are held into the capacitor region, thereby enabling a signal corresponding to a quantity of overflowed carriers to be outputted and widening the dynamic range.

In the CMOS area sensor, however, there is a problem that a color mixture with the adjacent pixel occurs irrespective of the presence or absence of the widening function of the dynamic range mentioned above. FIGS. 8A and 8B are diagrams showing a mechanism of the occurrence of the color mixture according to conventional pixel layouts. In FIG. 8A, a transfer unit 502 and a MOS unit 503 are arranged under a photodiode 501. When the pixels having such a layout are arranged, even if a device separating region is provided between the pixels, there is a case where the color mixture cannot be avoided. In the case of FIG. 8A, since the MOS unit 503 is arranged in the vertical direction or the like, a distance between the photodiodes of the adjacent pixels is larger than that of the adjacent pixels in the lateral direction. However, for example, as shown in FIG. 8A, photodiodes 501 and 504 are arranged in the lateral direction so as to sandwich only the device separating region. There is, consequently, such a problem that the color mixture occurs because the carriers which have been photoelectrically converted in a deep layer portion of silicon leak or light or the like which has obliquely entered and has been reflected by an aluminum layer or the like enters the adjacent photodiode.

As shown in FIG. 8B, a transfer unit 512 and a floating diffusion region 513 are provided on the right side of a photodiode 511 and the MOS unit is provided under the photodiode 511. Owing to such a layout, although a distance between the photodiode 511 and a photodiode 521 of the pixel which is adjacent on the right side of the photodiode 511 is larger than that in the case of FIG. 8A, since a distance between the floating diffusion region 513 and the photodiode 521 is small, there is a problem that the carriers leak into the floating diffusion region 513 and the color mixture occurs.

According to the layout disclosed in the above non-Patent Document, since it is necessary to set a large capacitor region, it exercises a large influence on the problem of the color mixture in dependence on the layout.

SUMMARY OF THE INVENTION

The invention is made in consideration of the foregoing circumstances and it is an object of the invention to provide a solid state image pickup device which can prevent color mixture by effectively using a layout of a capacitor region provided separately from a floating diffusion region and to provide a camera using such a solid state image pickup device.

The invention is made to solve the foregoing problem and according to the invention, there is provided a solid state image pickup device constructed by arranging unit pixels in a matrix shape, in which each unit pixel comprises: a photoelectric conversion unit where carriers are generated by incident light; a transfer unit adapted to transfer the carriers; a floating diffusion region where the carriers are transferred by the transfer unit; a carrier holding unit adapted to accumulate the carriers overflowed from the photoelectric conversion unit; and an output unit adapted to output a signal corresponding to the carriers transferred to the floating diffusion region, wherein one of the carrier holding unit and the output unit is provided between the photoelectric conversion unit included in the first pixel and the photoelectric conversion unit included in the second pixel adjacent to the first pixel in the row direction, and the other one of the carrier holding unit and the output unit is provided between the photoelectric conversion unit included in the first pixel and the photoelectric conversion unit included in the third pixel adjacent to the first pixel in the column direction.

In one embodiment, the transfer unit and the floating diffusion region may be arranged between the photoelectric conversion unit and the carrier holding unit.

According to the invention, there is provided a camera comprising: the solid state image pickup device; a lens adapted to focus an optical image onto the solid state image pickup device; and a diaphragm adapted to vary a quantity of light which passes through the lens.

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the invention will be described hereinbelow with reference to the drawings.

(First Embodiment)

Figure 1A:
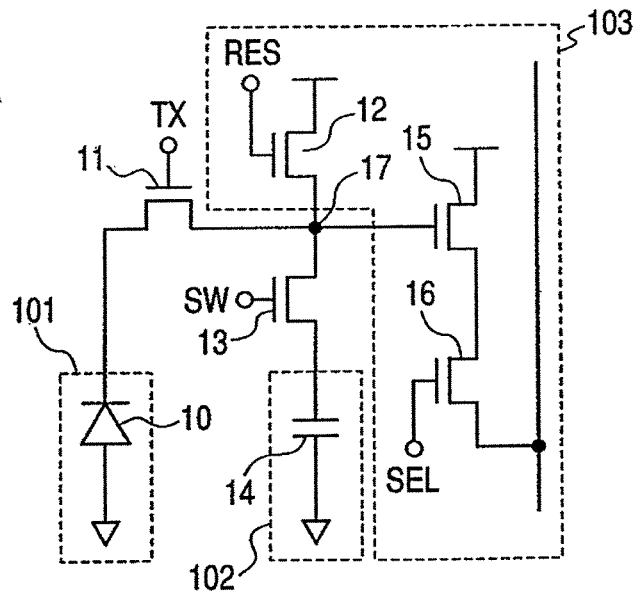
FIGS. 1A and 1B are diagrams showing an example of a circuit construction of each pixel of a solid state image pickup device according to an embodiment and a schematic example of a layout construction.
Figure 1B:
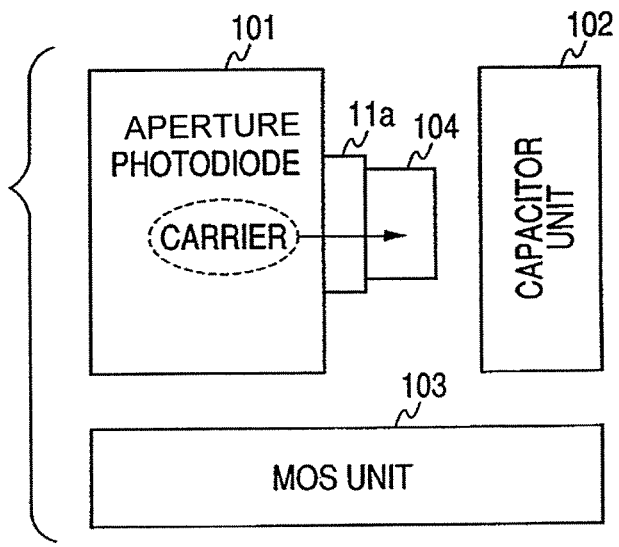

First, a solid state image pickup device (CMOS area sensor) in the first embodiment of the invention will be described. FIG. 1A is a diagram showing an example of a circuit construction of each pixel of the solid state image pickup device in the embodiment. FIG. 1B is a diagram showing a schematic example of a layout construction of each pixel of the solid state image pickup device in the embodiment.

First, the circuit construction of each pixel will be described with reference to FIG. 1A.

As shown in FIG. 1A, each pixel of the solid state image pickup device in the embodiment comprises: a photodiode 10; a first transfer MOS transistor 11; a reset MOS transistor 12; a second transfer MOS transistor 13; a carrier holding unit (capacitor) 14; a source-follower MOS transistor 15; and a selection MOS transistor 16. The pixels of the solid state image pickup device are arranged in a two-dimensional matrix shape of (a plurality of rows×a plurality of columns).

The photodiode 10 accumulates carriers generated by the incident light. The photodiode 10 is connected to an FD 17 through the first transfer MOS transistor 11. The FD 17 has a layout construction also serving as a drain terminal of the first transfer MOS transistor 11 and can hold the carriers which are transferred from the photodiode 10 through the first transfer MOS transistor 11. The FD 17 is mutually connected to a drain terminal of the reset MOS transistor 12, a gate terminal of the source-follower MOS transistor 15, and a drain terminal of the second transfer MOS transistor 13.

A source terminal of the second transfer MOS transistor 13 is connected to the ground through the carrier holding unit 14. Source terminals of the reset MOS transistor 12 and the source-follower MOS transistor 15 are connected to a power source line for supplying, for example, a power voltage VDD. A drain terminal of the source-follower MOS transistor 15 is mutually connected to a source terminal of the selection MOS transistor 16. A signal which changes in accordance with an amount of carriers transferred to the FD 17 is outputted from the transistor 16. As a circuit construction shown in FIG. 1A described above, a construction similar to that of each pixel of the solid state image pickup device described in the related background art (non-Patent Document) can be used.

Each of the first transfer MOS transistor 11, reset MOS transistor 12, second transfer MOS transistor 13, and selection MOS transistor 16 is ON/OFF controlled by a control signal which is supplied to a gate terminal of each of those transistors. When the control signal of the high level is supplied to the gate terminal, each of the first transfer MOS transistor 11, reset MOS transistor 12, second transfer MOS transistor 13, and selection MOS transistor 16 is turned on (made conductive). When control signal of the low level is supplied to the gate terminal, each of those transistors is turned off (made nonconductive).

Specifically speaking, as shown in FIG. 1A, a control signal TX is supplied to the gate terminal of the first transfer MOS transistor 11, a control signal SW is supplied to the gate terminal of the second transfer MOS transistor 13, a control signal SEL is supplied to the gate terminal of the selection MOS transistor 16, and control signal RES is supplied to the gate terminal of the reset MOS transistor 12, respectively.

The control signal TX is a control signal to transfer the carriers accumulated by the photoelectric conversion in the photodiode 10 to the FD 17. The control signal SW is a control signal to connect the FD 17 to the carrier holding unit 14. The control signal SEL is a control signal to select the pixel. The control signal RES is a control signal to reset an electric potential of the FD 17 to the power voltage VDD (for example, +5V).

Figure 2:
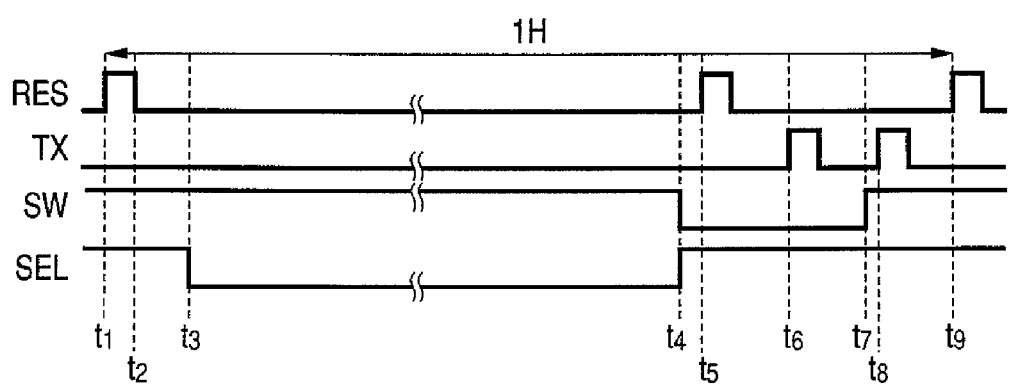
FIG. 2 is a timing chart showing an example of the operation of a pixel circuit of the solid state image pickup device shown in FIG. 1A.

An example of the operation of the pixel circuit of the solid state image pickup device shown in FIG. 1A will now be described. FIG. 2 is a timing chart showing the example of the operation of the pixel circuit of the solid state image pickup device shown in FIG. 1A. As shown in FIG. 2, since the control signals RES, SEL, TX, and SW are supplied, the pixel of FIG. 1A outputs the carriers, as a pixel signal, which have been photoelectrically converted in the photodiode 10 for a period of time corresponding to the control.

First, when the control signal RES is turned on at time t1 in the state where the control signals SW and SEL are ON and other control signals are OFF, the electric potentials of the FD 17 and the carrier holding unit 14 are reset to the power potential VDD. Since the control signal RES is turned off at time t2, the resetting operation is completed.

Subsequently, the control signal SEL is turned off at time t3. Thus, the accumulation of the carriers is started in the photodiode 10. Since the control signal SW is ON during the accumulation, for example, in the case where the photodiode 10 receives strong light and overflows and the carriers overflow to the FD 17, those carriers are accumulated in both of the FD 17 and the carrier holding unit 14.

Subsequently, the reading process of the pixel signal according to the carriers which have been photoelectrically converted in the photodiode 10 is executed. Specifically speaking, the control signal SW is turned off at time t4 and the control signal SEL is turned on at time t4. Thus, the FD 17 is disconnected from the carrier holding unit 14.

Subsequently, the control signal RES is turned on at time t5. Thus, for example, even if the carriers have been accumulated in the FD 17 due to the overflow of the photodiode 10, the electric potential of the FD 17 is reset to the power voltage VDD. Since the second transfer MOS transistor 13 is turned off by the turn-off of the control signal SW, the carrier holding unit 14 is not reset. That is, if the overflowed carriers exist, the carrier holding unit 14 continues to hold them. The control signal RES is turned off after a predetermined period from time t5 (time earlier than time t6, which will be explained hereinbelow).

Subsequently, since the control signal TX is turned on at time t6, the first transfer MOS transistor 11 is turned on and the carriers accumulated in the photodiode 10 are transferred to the FD 17. Thus, the output signal of the source-follower MOS transistor 15 according to the carriers which have been transferred to the FD 17 and held is outputted as a pixel signal.

Subsequently, the reading process of the pixel signal according to the overflowed carriers to widen the dynamic range is executed. If no overflow occurs in the photodiode 10, the carriers are not held in the carrier holding unit 14. However, explanation will be made here on the assumption that the carriers overflowed by the overflow have been held in the carrier holding unit 14.

Specifically speaking, when the control signal SW is turned on at time t7 and the control signal TX is turned on at time t8, the carriers which have overflowed by the overflow and have been held in the carrier holding unit 14 and the carriers held in the FD 17 are added. Thus, the output signal of the source-follower MOS transistor 15 according to the added carriers is outputted as a pixel signal. Subsequently, when the control signal RES is turned on at time t9, the electric potentials of the FD 17 and the carrier holding unit 14 are reset to the power potential VDD.

Since the pixel signal can be outputted on the basis of an amount of overflowed carriers which have been held in the carrier holding unit 14 owing to the circuit construction of FIG. 1A as described above, the dynamic range can be widened. It is preferable that the carrier holding unit 14 has a capacitance larger than that of the FD 17. Therefore, an area of the carrier holding unit 14 which occupies in the layout of each circuit element of the pixel is the second largest area next to the area of the photodiode 10.

An example of the layout of the circuit shown in FIG. 1A will now be described with reference to FIG. 1B. According to the layout example of the embodiment shown in FIG. 1B, the color mixture (It is referred as a crosstalk in the case of a monochromatic CMOS area sensor.) between the adjacent pixels can be reduced and a feature of the embodiment is shown. Component elements shown at reference numerals 101 to 103 in FIG. 1A correspond to those in FIG. 1B. That is, a photodiode region 101 is a region including the photodiode 10. A capacitor region 102 is a region including the carrier holding unit 14. A MOS unit region 103 is a region including the reset MOS transistor 12, source-follower MOS transistor 15, and selection MOS transistor 16. There is also a case where the MOS unit region 103 includes the second transfer MOS transistor 13 although its details will be explained hereinafter. It is assumed that the direction of the capacitor regions when they are seen from the photoelectric conversion unit is set to the column direction and the direction of the MOS unit regions is set to the row direction. However, the invention is not limited to them but the row direction and the column direction may be also exchanged.

A gate region 11a is a gate region constructing the gate terminal of the first transfer MOS transistor 11. An FD region 104 is a region constructing the FD 17 and is also a region constructing the drain terminal of the first transfer MOS transistor 11.

It is a feature of the layout shown in FIG. 1B and described above that if the photodiode region 101 is a rectangle (may be also an approximately rectangular), the capacitor region 102 is arranged on one side of the rectangle and the MOS unit region 103 is arranged on another side (which crosses the above one side) of the rectangle. It is desirable that each of the capacitor region 102 and the MOS unit region 103 is equal to or longer than one corresponding side of the photodiode region 101. In the capacitor region 102, it is possible to assure a capacitor by forming an n-type region or the like into a silicon substrate. However, preferably, a capacitor is formed on an oxide film without forming a conductive region such as an n-type region or the like into the silicon substrate.

A forming method of the capacitor region 102 will be described. To form the capacitor in the capacitor region 102, for example, it is considered to form a MOS capacitor or a double-layer POL (polysilicon) capacitor. Particularly, in the embodiment, it is preferable to use the double-layer POL capacitor in which there is no need to form a diffusion layer into the silicon substrate and which is constructed by forming double polysilicon layers on an oxide film or an LOCOS (Local Oxidation of Silicon) so as to sandwich a dielectric film. Thus, it is possible to prevent that the carriers from the adjacent pixel serving as a cause of the color mixture pass through the silicon substrate of the capacitor region 102.

It is also preferable to form the MOS capacitor in a part in the capacitor region 102. The MOS capacitor is a capacitor which is constructed by a method whereby the diffusion layer is formed on the silicon substrate, the dielectric film is formed on the diffusion layer, and a polysilicon layer is formed on the dielectric film.

The MOS capacitor and the double-layer POL capacitor can be also formed in the same region. By such a structure, a capacitance of the carrier holding unit 14 which is formed in the capacitor region 102 can be increased. Accordingly, an example of a construction in which the MOS capacitor and the double-layer POL capacitor are formed in the same region will be described hereinbelow.

First, a diffusion layer is formed in the surface region of a P well by doping (adding) n-type impurities therein. A capacitor (junction capacitor) is formed between the diffusion layer serving as an n-type region (region containing the n-type impurities) and the P well serving as a p-type region (region containing p-type impurities) and the carriers can be accumulated in the capacitor.

A first dielectric film is formed on the diffusion layer. In the case where the periphery of the diffusion layer is element-isolated by an insulating layer such as LOCOS or the like, the first dielectric film can be also formed on the insulating layer.

A first polysilicon layer is formed on the first dielectric film. The first dielectric film is connected to the power potential VDD or the ground potential. Subsequently, a second dielectric film is formed on the first polysilicon layer. A second polysilicon layer is formed on the second dielectric film.

As mentioned above, in the embodiment, a first capacitor is formed by the diffusion layer serving as an n-type region and the P well serving as a p-type region. A second capacitor is formed by the diffusion layer serving as an n-type region, the first polysilicon layer, and the first dielectric film. Further, a third capacitor is formed by the first polysilicon layer, the second polysilicon layer, and the second dielectric film. That is, to form the first to third capacitors, the P well, diffusion layer, first dielectric film, first polysilicon layer, second dielectric film, and second polysilicon layer are laminated.

The first polysilicon layer and the second polysilicon layer have the conductivity because the impurities are doped (added) therein. It is sufficient that the first polysilicon layer and the second polysilicon layer are made of a material having the conductivity and it is not always necessary to use polysilicon. Each of the first and second dielectric films is formed by laminating, for example, an $SiO_2$ film and an $SiN_2$ film. The thinner the first and second dielectric films are, the larger its capacitance is. Therefore, it is desirable to decrease the thickness of each of the first and second dielectric films within a limit range where the insulation of the first and second dielectric films is not broken or deteriorated by the applied voltage.

In the case of forming the diffusion layer (n-type region) into the silicon substrate, it is not formed around the side (left side in FIG. 1B) which faces a boundary with the adjacent pixel, thereby enabling a structure which is strong against the color mixture to be realized. A degree of distance to the side which faces the boundary where the diffusion layer (n-type region) is formed is determined in consideration of both of the specifications for prevention of the color mixture and the specifications of the capacitance which is necessary for the carrier holding unit 14.

By using the layout as mentioned above, the capacitor region 102 or the MOS unit region 103 is certainly arranged between the photodiode regions 101 of the pixels which are neighboring in the vertical direction or the pixels which are neighboring in the lateral direction. That is, the photodiode region 101 serving as a target where the carriers of the color mixture enter is arranged at a remote position from the photodiode region 101 of another adjacent pixel. The FD region 104 serving as a target where the carriers of the color mixture enter is also arranged at a remote position from the photodiode region 101 or FD region 104 of another pixel. The capacitor region 102 has the structure which is strong against the color mixture as mentioned above. As for the MOS unit region 103, the carriers which become a cause of the color mixture can be absorbed in the drain region. Consequently, the color mixture can be reduced more than the case of the conventional one by using the layout of the capacitor region 102 provided separately from the FD region 104.

By substantially equalizing a length of one side of the photodiode region 101 in which it is necessary to assure the largest area with that of one side of the capacitor region 102 in which it is necessary to assure the second largest area, the efficient layout is realized. By arranging the FD region 104 between the photodiode region 101 and the capacitor region 102, the efficient layout according to a transfer path of the carriers shown by an arrow in FIG. 1B can be also realized.

An example of a more detailed layout of the schematic layout shown in FIG. 1B will now be described.

Figure 3:
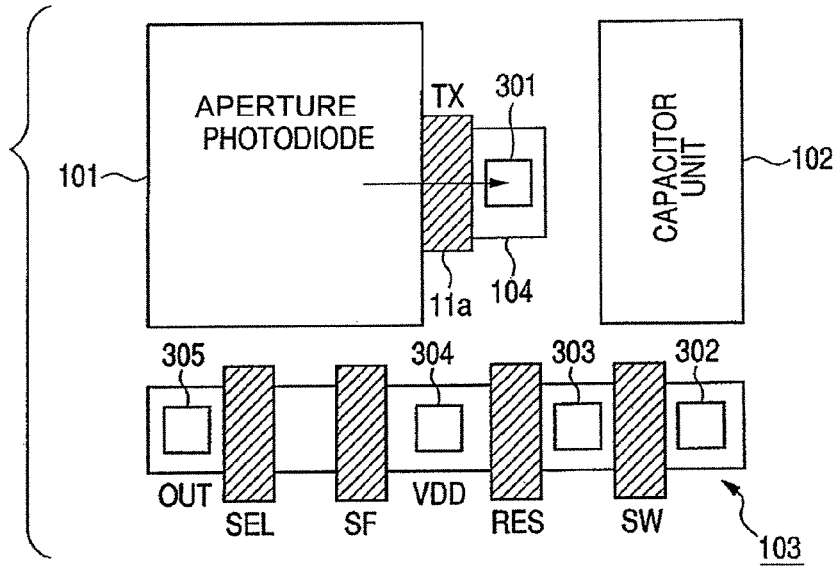
FIG. 3 is a diagram showing an example of a more detailed layout of the schematic layout shown in FIG. 1B.

FIG. 3 is a diagram showing the example of the more detailed layout of the schematic layout shown in FIG. 1B. As shown in FIG. 3, four gate regions are formed in the MOS unit region 103. That is, a gate region SEL including the gate terminal of the selection MOS transistor 16, a gate region SF including the gate terminal of the source-follower MOS transistor 15, a gate region RES including the gate terminal of the reset MOS transistor 12, and a gate region SW including the gate terminal of the second transfer MOS transistor 13 are arranged from the left side. The foregoing control signals SEL, RES, and SW are inputted to the gate regions SEL, RES, and SW.

A region on the left side of the gate region SEL is a drain region constructing a drain terminal of the selection MOS transistor 16 and a contact 305 to output the pixel signal to the outside is arranged in this drain region. A region between the gate regions SF and RES is a source region where the source terminal of the source-follower MOS transistor 15 and the source terminal of the reset MOS transistor 12 are used in common and a contact 304 to connect to the power line for supplying the power potential VDD is arranged in this source region.

In an alternating example, the FD region 104 may be arranged between the photodiode region 101 and the MOS unit region 103. It is to be understood that the MOS unit region operates as an output unit adapted to output a signal corresponding to a signal transferred to the floating diffusion region.

A region between the gate regions RES and SW is a drain region where the drain terminal of the reset MOS transistor 12 and the drain terminal of the second transfer MOS transistor 13 are used in common and a contact 303 to connect to the FD region 104 is arranged in this drain region. A region on the right side of the gate region SW is a source region constructing the source terminal of the second transfer MOS transistor 13 and a contact 302 to connect to the capacitor region 102 is arranged in this source region. A contact 301 to connect to the contact 303 is arranged in the FD region 104.

As shown in FIG. 3, by providing the drain region which uses in common the drain terminal of the reset MOS transistor 12 and the drain terminal of the second transfer MOS transistor 13, it is possible to prevent that the capacitance of the FD 17 is set to be too large. It is necessary to properly set the value of the capacitance of the FD 17. If it is set to be too large, a deterioration in gain occurs upon reading of the carriers, to deteriorate a signal to noise ratio. Therefore, among the three drain regions of the first transfer MOS transistor 11, reset MOS transistor 12, and second transfer MOS transistor 13 which exert an influence on the capacitance of the FD 17, the two drain regions are used in common, thereby suppressing the capacitance of the FD 17 lower than that in the case where the drain regions of the first transfer MOS transistor 11, reset MOS transistor 12, and second transfer MOS transistor 13 are formed by one region as shown in, for example, FIG. 5, which will be explained hereinafter.

Figure 4:
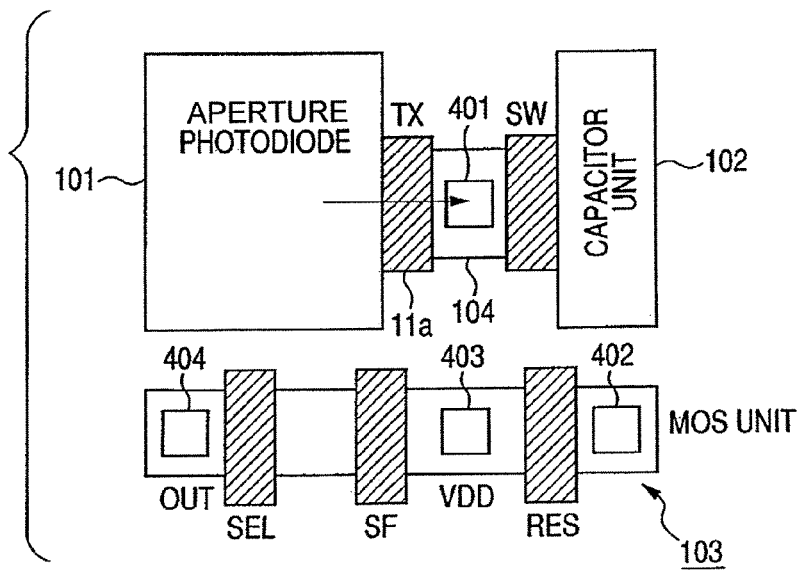
FIG. 4 is a diagram showing an example of a more detailed layout of the schematic layout shown in FIG. 1B and shows the layout different from FIG. 3.

A layout example different from that in FIG. 3 will now be described. FIG. 4 is a diagram showing an example of a more detailed layout of the schematic layout shown in FIG. 1B and shows the layout different from FIG. 3. FIG. 4 differs from FIG. 3 with respect to a point that the gate region SW is not formed into the MOS unit region 103 but the gate region SW is formed between the FD region 104 and the capacitor region 102. In FIG. 4, since contacts 404 and 403 are similar to the contacts 305 and 304 in FIG. 3, their explanation is omitted here.

A contact 402 is arranged in the drain region including the drain terminal of the reset MOS transistor 12 and is used to connect to a contact 401 of the FD region 104. The FD region 104 is also a drain region including the drain terminal of the first transfer MOS transistor 11 and the drain terminal of the second transfer MOS transistor 13. That is, in FIG. 4, by using in common the drain region of the first transfer MOS transistor 11 and the drain region of the second transfer MOS transistor 13, it is prevented that the capacitance of the FD 17 becomes too large. There is also such an advantage that by using the layout of FIG. 4, an area of each pixel can be reduced smaller than that in the layout of FIG. 3.

Figure 5:
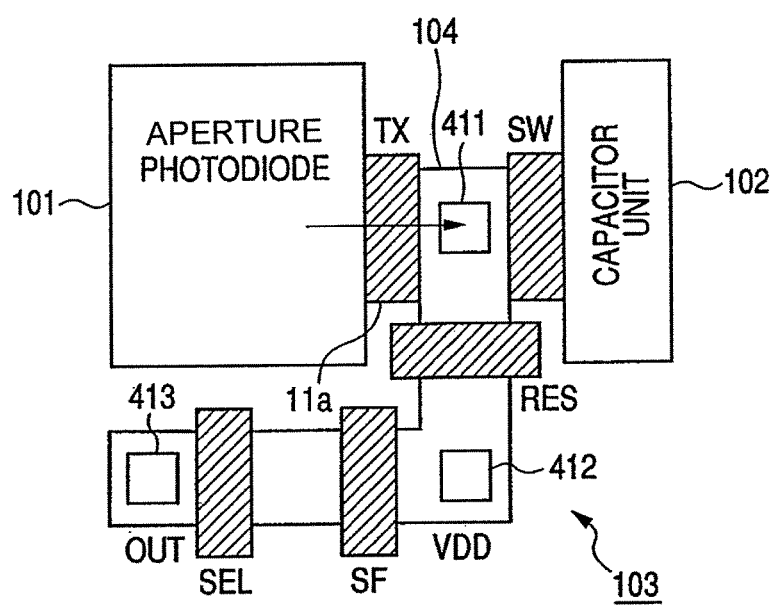
FIG. 5 is a diagram showing an example of a more detailed layout of the schematic layout shown in FIG. 1B and shows the layout different from FIG. 4.

An example of the layout different from that of FIG. 4 will now be described. FIG. 5 is a diagram showing the example of the more detailed layout of the schematic layout shown in FIG. 1B and shows the layout different from FIG. 4. FIG. 5 differs from FIG. 4 with respect to a point that the gate region RES of the MOS unit region 103 is arranged in such a manner that the FD region 104 is used as a drain region and the source region is used in common with the source-follower MOS transistor 15. In FIG. 5, since contacts 412 and 413 are similar to the contacts 403 and 404 in FIG. 4, their explanation is omitted here.

A contact 411 in FIG. 5 is used to connect to the gate region SF. As shown in FIG. 5, the drain regions of the first transfer MOS transistor 11, reset MOS transistor 12, and second transfer MOS transistor 13 are used in common. Thus, although the capacitance of the FD 17 increases, since the number of wirings is smaller than that in the case of FIG. 3 or 4, a wiring density can be reduced. Consequently, a yield can be improved. Either the construction in which by using the layout of FIG. 5, the improvement of the yield by the reduction in the wiring density is realized in place of the increase in the capacitance of the FD or the construction in which by using the layout of FIG. 3 or 4, the increase in the capacitance of the FD is prevented may be properly selectively used in accordance with needs of the user.

(Other Embodiments)

An embodiment in the case where the solid state image pickup device in each embodiment mentioned above is applied to a still camera will now be described in detail with reference to FIG. 6.

Figure 6:
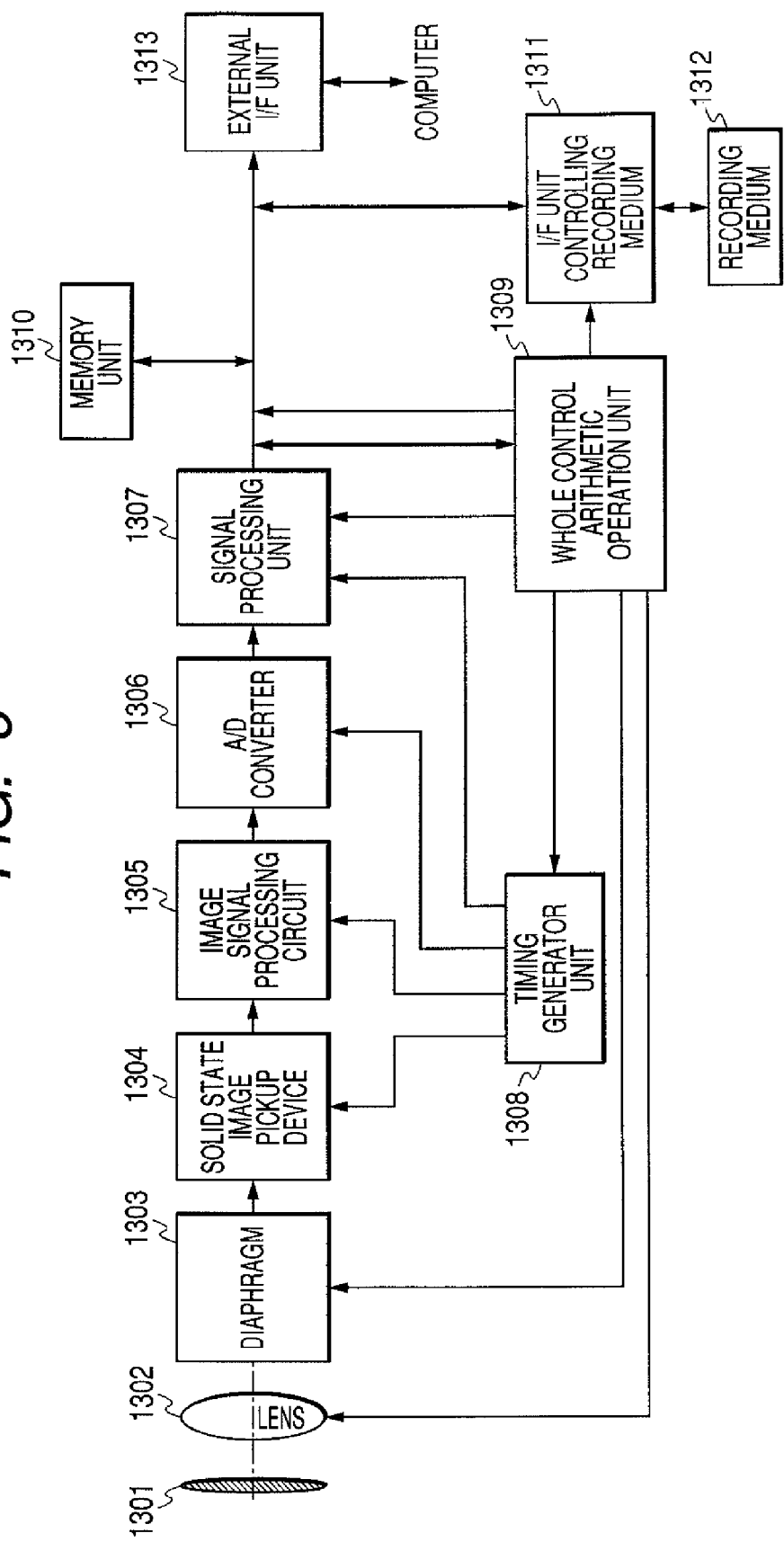
FIG. 6 is a block diagram showing the case where the solid state image pickup device in each embodiment mentioned above is applied to a "still camera"

FIG. 6 is a block diagram showing the case where the solid state image pickup device in each embodiment mentioned above is applied to the "still camera".

In FIG. 6, reference numeral 1301 denotes a barrier serving as both of a lens protecting device and a main switch; 1302 a lens for focusing an optical image of an object onto a solid state image pickup device 1304; 1303 a diaphragm for varying a quantity of light which passes through the lens 1302; 1304 the solid state image pickup device for fetching the object image formed by the lens 1302 as an image signal; and 1306 an A/D converter for converting the analog image signal which is outputted from the solid state image pickup device 1304 into digital data.

Reference numeral 1307 denotes a signal processing unit for making various kinds of correction to the image data outputted from the A/D converter 1306 or compressing the data; 1308 a timing generator unit for outputting various timing signals to the solid state image pickup device 1304, an image signal processing unit 1305, the A/D converter 1306, and the signal processing unit 1307; 1309 a whole control arithmetic operation unit for executing various arithmetic operations and controlling the whole still video camera; 1310 a memory unit for temporarily storing the image data; 1311 an interface unit (I/F unit) for recording or reading out data into/from a recording medium; 1312 a detachable recording medium such as a semiconductor memory or the like into/from which the image data is recorded or read out; and 1313 an interface unit for communicating with an external computer or the like.

The operation of the still video camera in the photographing mode in the foregoing construction will now be described.

When the barrier 1301 is opened, a main power source is turned on, a power source of a control system is subsequently turned on, and further, a power source of photographing system circuits such as an A/D converter 1306 and the like is turned on.

After that, to control an exposure amount, the whole control arithmetic operation unit 1309 opens the diaphragm 1303. The signal outputted from the solid state image pickup device 1304 is converted by the A/D converter 1306 and subsequently inputted to the signal processing unit 1307.

On the basis of the data inputted to the signal processing unit 1307, the whole control arithmetic operation unit 1309 arithmetically operates the exposure.

A brightness is discriminated on the basis of a result of a photometry and the whole control arithmetic operation unit 1309 controls the diaphragm in accordance with the discriminated brightness.

On the basis of the signal outputted from the solid state image pickup device 1304, the whole control arithmetic operation unit 1309 extracts high frequency components and arithmetically operates a distance to the object. After that, the lens is moved and whether or not an in-focus state has been obtained is discriminated. If it is determined that the in-focus state is not obtained, the lens is driven and a distance measurement is performed again.

After the in-focus state is confirmed, the main exposure is started. After the exposure is finished, the image signal outputted from the solid state image pickup device 1304 is A/D converted by the A/D converter 1306. The obtained digital data is transmitted through the signal processing unit 1307 and written into the memory unit 1310 by the whole control arithmetic operation unit 1309.

After that, the data stored in the memory unit 1310 is transmitted through the recording medium controlling I/F unit 1311 and recorded into the detachable recording medium 1312 such as a semiconductor memory or the like under the control of the whole control arithmetic operation unit 1309. It is also possible to construct in such a manner that the data is transmitted through the external I/F unit 1313 and directly inputted to a computer or the like and the image is modified.

An embodiment in the case where the solid state image pickup device in each embodiment mentioned above is applied to a video camera will now be described in detail with reference to FIG. 7.

Figure 7:
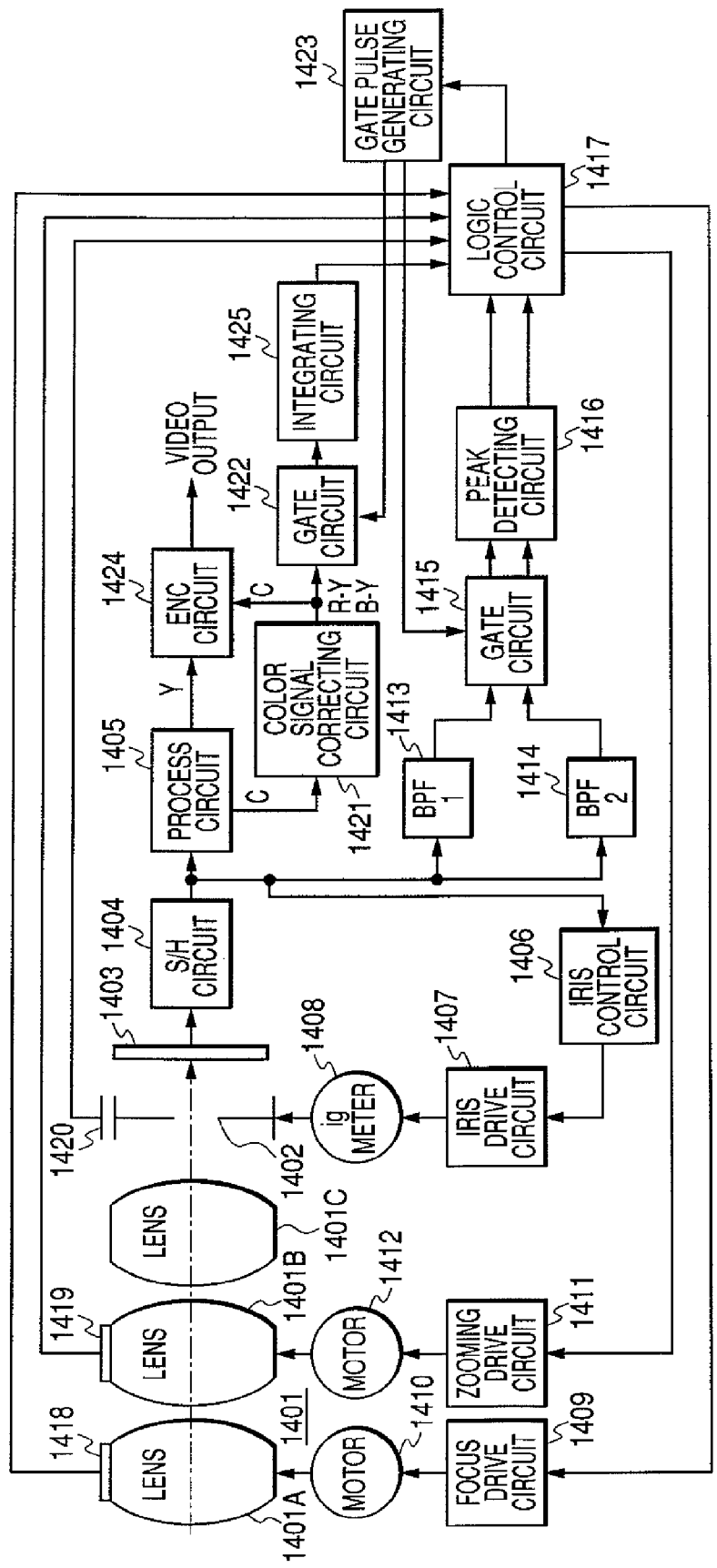
FIG. 7 is a block diagram showing the case where the solid state image pickup device in each embodiment mentioned above is applied to a "video camera"
Figure 8A:
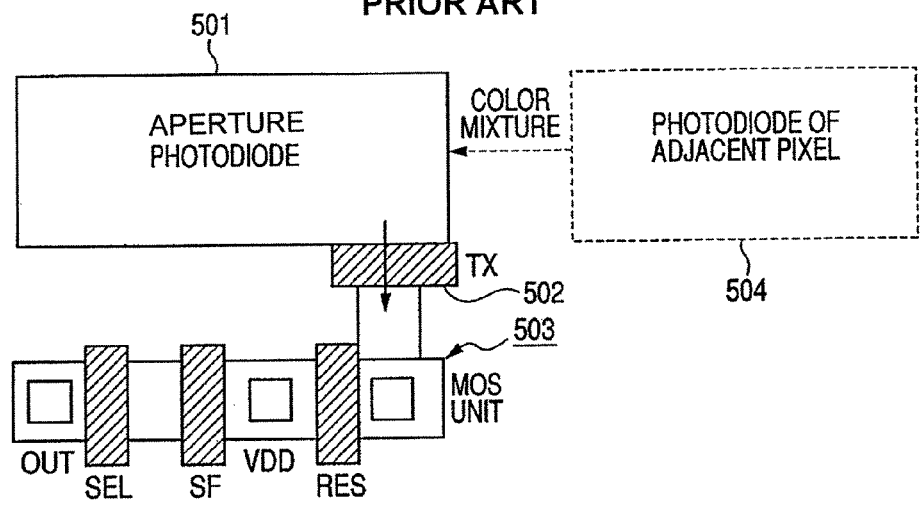
FIGS. 8A and 8B are diagrams showing a mechanism of the occurrence of color mixture according to conventional pixel layouts.
Figure 8B:
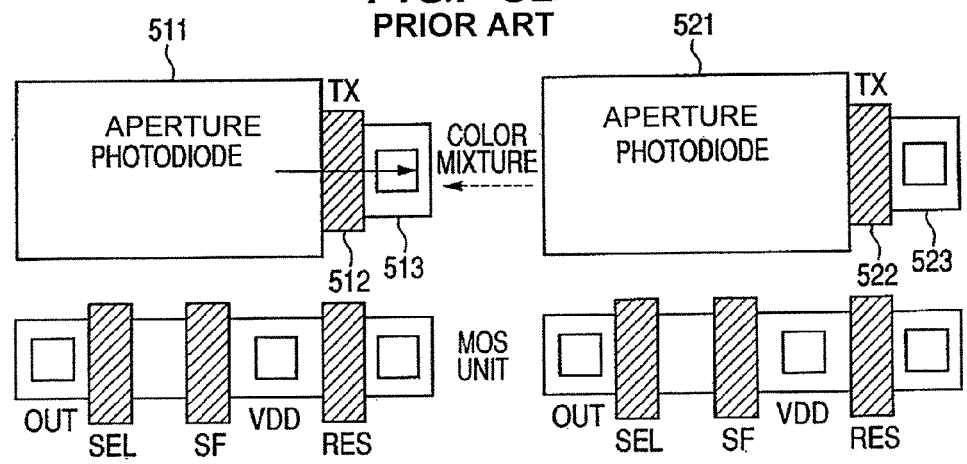

FIG. 7 is a block diagram showing the case where the solid state image pickup device in each embodiment mentioned above is applied to the "video camera". In FIG. 7, reference numeral 1401 denotes a photographing lens having: a focusing lens 1401A to make a focal adjustment; a zooming lens 1401B to execute the zooming operation; and an image forming lens 1401C.

Reference numeral 1402 denotes a diaphragm; 1403 a solid state image pickup device for photoelectrically converting an object image formed on an image pickup surface into an electric image signal; and 1404 a sample and hold circuit (S/H circuit) for sampling and holding the image signal outputted from the solid state image pickup device 1304, further, amplifying a signal level, and outputting the amplified image signal.

Reference numeral 1405 denotes a process circuit for executing predetermined processes such as gamma correction, color separation, blanking process, and the like to the video signal outputted from the S/H circuit 1404 and outputting a luminance signal Y and a chroma signal C. The chroma signal C outputted from the process circuit 1405 is supplied to a color signal correcting circuit 1421, by which a white balance and a color balance are corrected and color difference signals R-Y and B-Y are outputted.

The luminance signal Y outputted from the process circuit 1405 and the color difference signals R-Y and B-Y outputted from the color signal correcting circuit 1421 are modulated by an encoder circuit (ENC circuit) 1424 and outputted as a standard television signal. The standard TV signal is supplied to a video recorder (not shown) or an electronic view finder such as a monitor EVF (Electric View Finder) (not shown) or the like.

Reference numeral 1406 denotes an iris control circuit for controlling an iris drive circuit 1407 on the basis of the video signal supplied from the S/H circuit 1404 and automatically controlling an ig meter 1408 in order to control an aperture amount of the diaphragm 1402 so as to set the level of the video signal to a predetermined level value.

Reference numerals 1413 and 1414 denote band pass filters (BPFs) of different band limitation values each for extracting high frequency components necessary to detect the in-focus state from the video signal outputted from the S/H circuit 1404. The signals outputted from the first band pass filter 1413 (BPF1) and the second band pass filter 1414 (BPF2) are gated by a gate circuit 1415 and a focus gate frame signal. A peak value is detected and held by a peak detecting circuit 1416 and inputted to a logic control circuit 1417. This signal is called a focal voltage and the focus is set to the in-focus state by the focal voltage.

Reference numeral 1418 denotes a focusing encoder for detecting a moving position of the focusing lens 1401A; 1419 a zooming encoder for detecting a focal distance of the zooming lens 1401B; and 1420 an iris encoder for detecting the aperture amount of the diaphragm 1402. Detection values of those encoders are supplied to the logic control circuit 1417 to make system control.

The logic control circuit 1417 performs the focal detection to the object and makes the focal adjustment on the basis of the video signal corresponding to a portion in a set focal detection region. That is, the logic control circuit 1417 fetches the peak value information of the high frequency components supplied from the BPFs 1413 and 1414, supplies control signals of a rotating direction, rotational speed, rotation/stop, and the like of a focusing motor 1410 to a focus drive circuit 1409 so as to drive the focusing lens 1401A to a position where the peak value of the high frequency components becomes maximum, and control them.

Although the embodiments of the invention have been described in detail above with reference to the drawings, the specific constructions are not limited to those of the embodiments but designs and the like in the scope which does not depart from the essence of the invention are also incorporated in the invention.

This application claims priority from Japanese Patent Application No. 2005-080342 filed on Mar. 18, 2005, which is hereby incorporated by reference herein.

What is claimed is:

1. A solid state image pickup device comprising:
   a plurality of pixels arranged in a matrix,
   wherein each of the plurality of pixels includes:
      a photoelectric conversion unit for generating electronic carriers based on incident light;
      a floating diffusion region for receiving the electronic carriers transferred from the photoelectric conversion unit;
      a carrier holding unit for accumulating the electronic carriers generated in the photoelectric conversion unit; and
      a plurality of transistors for outputting a signal of each of the plurality of pixels,
   wherein the plurality of pixels includes first pixels and second pixels,
   wherein the floating diffusion region of the first pixel and the carrier holding unit of the first pixel are arranged between the photoelectric conversion unit of the first pixel and the photoelectric conversion unit of the second pixel, and
   wherein the carrier holding unit includes a plurality of polysilicon layers laminated to sandwich a dielectric film therebetween.

2. The solid state image pickup device according to claim 1, wherein the plurality of transistors include a reset unit configured to reset a potential of the floating diffusion region.

3. The solid state image pickup device according to claim 1, wherein the floating diffusion region and the carrier holding unit are connected via a switch.

4. The solid state image pickup device according to claim 1,
   wherein the electronic carriers generated in the photoelectric conversion unit are held by the carrier holding unit,
   wherein the electronic carriers held by the carrier holding unit are held by the floating diffusion region, and
   wherein a signal based on the electronic carriers held by the floating diffusion region is outputted from an output terminal.

5. The solid state image pickup device according to claim 2, wherein the reset unit has a drain region commonly used as the floating diffusion region.

6. The solid state image pickup device according to claim 2,
   wherein the floating diffusion region is connected via a switch to one terminal of the carrier holding unit, and
   wherein the switch which is commonly used as a drain region of the reset unit.

7. The solid state image pickup device according to claim 1, wherein the plurality of polysilicon layers of the carrier holding unit are arranged on an insulating layer.

8. The solid state image pickup device according to claim 1, wherein the carrier holding unit further includes a MOS capacitor portion.

9. A camera comprising:
   a solid state image pickup device that includes:
      a plurality of pixels arranged in a matrix,
      wherein each of the plurality of pixels includes:
         a photoelectric conversion unit for generating electronic carriers based on incident light;
         a floating diffusion region for receiving the electronic carriers transferred from the photoelectric conversion unit;
         a carrier holding unit for accumulating the electronic carriers generated in the photoelectric conversion unit; and
         a plurality of transistors for outputting a signal of each of the plurality of pixels,
      wherein the plurality of pixels includes first pixels and second pixels,
      wherein the floating diffusion region of the first pixel and the carrier holding unit of the first pixel are arranged between the photoelectric conversion unit of the first pixel and the photoelectric conversion unit of the second pixel, and
      wherein the carrier holding unit includes a plurality of polysilicon layers laminated to sandwich a dielectric film therebetween;
   a lens for focusing an optical image onto the solid state image pickup device; and
   a diaphragm adapted to vary a quantity of light which passes through the lens.

* * * * *